(12) United States Patent
Kaizuka et al.

(10) Patent No.: US 11,955,938 B2
(45) Date of Patent: Apr. 9, 2024

(54) ACOUSTIC OUTPUT DEVICE AND ACOUSTIC OUTPUT METHOD

(71) Applicants: The University of Tokyo, Tokyo (JP); KOGAKUIN UNIVERSITY, Tokyo (JP); Foster Electric Company, Limited, Akishima-shi (JP)

(72) Inventors: Tsutomu Kaizuka, Tokyo (JP); Kimihiko Nakano, Tokyo (JP); Yoshio Koike, Akishima (JP); Yoshiteru Uchida, Akishima (JP); Manabu Sasajima, Akishima (JP)

(73) Assignees: The University of Tokyo, Tokyo (JP); KOGAKUIN UNIVERSITY, Tokyo (JP); Foster Electric Company, Limited, Akishima (JP)

( * ) Notice: Subject to any disclaimer, the term of this patent is extended or adjusted under 35 U.S.C. 154(b) by 9 days.

(21) Appl. No.: 17/642,538

(22) PCT Filed: Sep. 11, 2020

(86) PCT No.: PCT/JP2020/034592
§ 371 (c)(1),
(2) Date: Mar. 11, 2022

(87) PCT Pub. No.: WO2021/049652
PCT Pub. Date: Mar. 18, 2021

(65) Prior Publication Data
US 2022/0329224 A1 Oct. 13, 2022

Related U.S. Application Data

(60) Provisional application No. 62/899,229, filed on Sep. 12, 2019.

(51) Int. Cl.
*H04R 3/00* (2006.01)
*H03G 3/30* (2006.01)
(Continued)

(52) U.S. Cl.
CPC .......... *H03G 3/3005* (2013.01); *H04R 1/403* (2013.01); *H04R 3/12* (2013.01);
(Continued)

(58) Field of Classification Search
CPC ........................... H04R 1/402; H04R 2430/01
(Continued)

(56) References Cited

U.S. PATENT DOCUMENTS

| | | | |
|---|---|---|---|
| 10,080,088 B1 * | 9/2018 | Yang | H04S 7/30 |
| 10,945,068 B2 * | 3/2021 | Deng | H04S 7/303 |

(Continued)

FOREIGN PATENT DOCUMENTS

CN 1941075 A 4/2007

OTHER PUBLICATIONS

A.M. Pasqual, "Analysis of the complex sound power in the near field of spherical loudspeaker arrays", Journal of Sound and Vibration, 456 (2019) 331-352.

*Primary Examiner* — Disler Paul
(74) *Attorney, Agent, or Firm* — Procopio, Cory, Hargreaves & Savitch LLP

(57) ABSTRACT

Proposed is an acoustic output device that obtains enough distance attenuation to achieve localization of a sound field by controlling the driving of a loudspeaker array by use of a more compact shape. The acoustic output device 10 comprises: a loudspeaker array 20 that includes a plurality of loudspeakers 20-1, 20-2, . . . , 20-N arranged in a two-dimensional plane; and an amplifier array 40 that includes a plurality of amplifiers 40-1, 40-2, . . . , 40-N that control the amplitude and phase of the drive signals for each loudspeaker according to the eigenvectors of the predetermined radiation mode of the loudspeaker array 20.

7 Claims, 13 Drawing Sheets

(51) Int. Cl.
*H04R 1/40* (2006.01)
*H04R 3/12* (2006.01)

(52) U.S. Cl.
CPC . *H03G 2201/103* (2013.01); *H04R 2201/401* (2013.01); *H04R 2430/01* (2013.01)

(58) Field of Classification Search
USPC .............................................. 381/77, 82, 97
See application file for complete search history.

(56) References Cited

U.S. PATENT DOCUMENTS 11,166,090 B2 * 11/2021 Alexander ............. H04R 9/063
11,516,614 B2 * 11/2022 Lee ......................... H04S 3/008

* cited by examiner

Fig. 5

| 0.50 | 0.0 | -0.50 |
|---|---|---|
| -1.0 | 0.0 | 1.0 |
| 0.50 | 0.0 | -0.50 |

Fig. 6

| -0.50 | 1.0 | -0.50 |
|---|---|---|
| 0.0 | 0.0 | 0.0 |
| 0.50 | -1.0 | 0.50 |

Fig. 7

| 0.51 | 0.10 | 0.51 |
|---|---|---|
| -0.61 | -1.0 | -0.61 |
| 0.51 | 0.10 | 0.51 |

Fig. 8

| 0.26 | -1.0  | 0.26 |
|------|-------|------|
| 0.74 | -0.48 | 0.74 |
| 0.26 | -1.0  | 0.26 |

Fig. 9

| -1.0 | 0.0 | 1.0  |
|------|-----|------|
| 0.0  | 0.0 | 0.0  |
| 1.0  | 0.0 | -1.0 |

Fig. 10

| -1.0 | -0.97 | -1.0 |
|------|-------|------|
| 0.0  | 0.0   | 0.0  |
| 1.0  | 0.97  | 1.0  |

Fig. 11

| 1.0 | 0.0 | -1.0 |
|---|---|---|
| 0.95 | 0.0 | -0.95 |
| 1.0 | 0.0 | -1.0 |

Fig. 12

| 1.0 | 0.92 | 1.0 |
|---|---|---|
| 0.92 | 0.83 | 0.92 |
| 1.0 | 0.92 | 1.0 |

Fig. 13

| 0.35 | -0.58 | 0.35 |
|---|---|---|
| -0.61 | 1.0 | -0.61 |
| 0.35 | -0.58 | 0.35 |

Fig. 14

| 0.64 | 0.0 | -0.64 |
|---|---|---|
| -1.0 | 0.0 | 1.0 |
| 0.64 | 0.0 | -0.64 |

Fig. 15

| -0.70 | 1.0 | -0.70 |
|---|---|---|
| 0.0 | 0.0 | 0.0 |
| 0.70 | -1.0 | 0.70 |

Fig. 16

| 0.65 | 0.60 | 0.65 |
|---|---|---|
| -0.66 | -1.0 | -0.66 |
| 0.65 | 0.60 | 0.65 |

Fig. 17

| 0.65 | -0.99 | 0.65 |
|---|---|---|
| 1.0 | -0.74 | 1.0 |
| 0.65 | -0.99 | 0.65 |

Fig. 18

| -1.0 | 0.0 | 1.0 |
|---|---|---|
| 0.0 | 0.0 | 0.0 |
| 1.0 | 0.0 | -1.0 |

Fig. 19

| -0.74 | -1.0 | -0.74 |
|---|---|---|
| 0.0 | 0.0 | 0.0 |
| 0.74 | 1.0 | 0.74 |

| 0.84 | 0.0 | -0.84 |
| --- | --- | --- |
| 1.0 | 0.0 | -1.0 |
| 0.84 | 0.0 | -0.84 |

| 0.47 | 0.77 | 0.47 |
| --- | --- | --- |
| 0.65 | 1.0 | 0.65 |
| 0.47 | 0.77 | 0.47 |

ACOUSTIC OUTPUT DEVICE AND ACOUSTIC OUTPUT METHOD

CROSS-REFERENCE TO RELATED APPLICATIONS

This application is a U.S. National Stage entry of PCT Application No: PCT/JP2020/034592 filed Sep. 11, 2020, which claims priority to U.S. Patent Application No. 62/899,229 filed Sep. 12, 2019, the contents of which are incorporated herein by reference.

I. TECHNICAL FIELD

The present invention relates to an acoustic output device and an acoustic output method.

II. BACKGROUND ART

When sound reaches a specific user and does not reach the people around that user, a personal acoustic space can be realized for that specific user alone. When each user has a personal acoustic space, they can listen to different sounds (such as music or voice communication) at the same time without interference even if they are close to each other. When realizing sound field localization, two aspects have to be taken into account: control of the direction in which sound is propagated and control of the distance range reached by the sound. Control of the direction of sound propagation means delivering sound only in a predetermined direction. Controlling the direction of sound propagation using a loudspeaker with high directivity is well known. Controlling the distance range reached by a sound means delivering sound only within a predetermined distance range. The distance attenuation of the sound radiating from a normal loudspeaker has an inverse square characteristic in which the sound pressure level drops by 6 dB every time the sound propagation distance is doubled, so distance attenuation has to exceed the inverse square characteristic in order to realize sound field localization. In response to this situation, Non-Patent Document 1 describes a method of obtaining sufficient distance attenuation to realize sound field localization. In this method, the eigenvectors for the radiation modes of a polyhedral loudspeaker array are calculated, and the amplitude and phase of each loudspeaker are controlled based on the calculated eigenvectors.

CITATION LIST

Non-Patent Literature

Non-Patent Document 1: A. M. Pasqual, "Analysis of the complex sound power in the near field of spherical loudspeaker arrays," Journal of Sound and Vibration, 456 (2019) 331-352

III. SUMMARY OF INVENTION

Technical Problem

However, when a loudspeaker array is polyhedral as described in Non-Patent Document 1, the large size of the loudspeaker array is not suitable for realizing personal acoustic spaces.

Therefore, it is an object of the present invention to propose an acoustic output device and an acoustic output method that obtain distance attenuation sufficient for realizing sound field localization using a more compact shape.

Solution to Problem

In order to achieve this object, the present invention is an acoustic output device comprising: a loudspeaker array with a plurality of loudspeakers arranged in a two-dimensional plane; and an amplifier array with a plurality of amplifiers, the amplifier array controlling the amplitude and phase of a drive signal for each loudspeaker according to eigenvectors of the predetermined radiation mode of the loudspeaker array. By arranging the loudspeaker array in a two-dimensional plane, the size of the loudspeaker array can be reduced and the loudspeaker array made more suitable for realizing a personal acoustic space.

An eigenvector used in loudspeaker array drive control can be, for example, an eigenvector at a certain frequency of the predetermined radiation mode. The amplifier array may control the amplitude and phase of the drive signals for each loudspeaker in a certain frequency range including the certain frequency. Because the frequency dependence of eigenvectors in the same radiation mode is low, eigenvectors at a certain frequency in a certain radiation mode can be used to realize sound field localization at a sufficient level for practical use in a frequency range that includes this frequency. As a result, the amplitude and phase for each loudspeaker do not have to be controlled using different eigenvectors for each frequency, and loudspeaker array drive control can be simplified.

The distance between a point and each loudspeaker, the upper limit of the frequency range, and the allowable time delay for the drive signals may be predetermined so that the deviation in the phase difference from 180° in sound waves generated by two loudspeakers driven at substantially the same amplitude so that the phase difference determined from the eigenvectors is 180° and limited to a predetermined angular range (for example, ±2°) at the point, which is a predetermined distance from the center of the loudspeaker array on the normal of the two-dimensional plane. Preferably, the allowable time delay for the drive signals of each loudspeaker is substantially zero. In this way, distance attenuation suitable for realizing sound field localization can be obtained.

Here, the predetermined radiation mode is preferably, for example, a radiation mode corresponding to an eigenvalue above a threshold value. The threshold value is a value differentiating radiation modes corresponding to relatively low eigenvalues and radiation modes corresponding to relatively high eigenvalues among the radiation modes. By driving the loudspeaker array using radiation modes corresponding to eigenvalues above the threshold value, the ratio of reactive sound power to active sound power can be increased to make it suitable for sound field localization.

The acoustic output method of the present invention comprises the steps of: preparing a loudspeaker array with a plurality of loudspeakers arranged in a two-dimensional plane; and causing an amplifier array with a plurality of amplifiers to control the amplitude and phase of a drive signal for each loudspeaker according to eigenvectors of the predetermined radiation mode of the loudspeaker array. By arranging the loudspeaker array in a two-dimensional plane, the size of the loudspeaker array can be reduced and the loudspeaker array made more suitable for realizing a personal acoustic space.

Advantageous Effects of Invention

Because the loudspeaker array in the present invention is arranged in a two-dimensional plane, the size of the loudspeaker array can be reduced and the loudspeaker array made more suitable for realizing a personal acoustic space.

IV. BRIEF DESCRIPTION OF DRAWINGS

FIG. 5 is a matrix showing the results of a numerical analysis of eigenvectors of a loudspeaker array in an embodiment of the present invention in the second-order radiation mode at 300 Hz.

FIG. 6 is a matrix showing the results of a numerical analysis of eigenvectors of a loudspeaker array in an embodiment of the present invention in the third-order radiation mode at 300 Hz.

FIG. 7 is a matrix showing the results of a numerical analysis of eigenvectors of a loudspeaker array in an embodiment of the present invention in the fourth-order radiation mode at 300 Hz.

FIG. 8 is a matrix showing the results of a numerical analysis of eigenvectors of a loudspeaker array in an embodiment of the present invention in the fifth-order radiation mode at 300 Hz.

FIG. 9 is a matrix showing the results of a numerical analysis of eigenvectors of a loudspeaker array in an embodiment of the present invention in the sixth-order radiation mode at 300 Hz.

FIG. 10 is a matrix showing the results of a numerical analysis of eigenvectors of a loudspeaker array in an embodiment of the present invention in the seventh-order radiation mode at 300 Hz.

FIG. 11 is a matrix showing the results of a numerical analysis of eigenvectors of a loudspeaker array in an embodiment of the present invention in the eighth-order radiation mode at 300 Hz.

FIG. 12 is a matrix showing the results of a numerical analysis of eigenvectors of a loudspeaker array in an embodiment of the present invention in the ninth-order radiation mode at 300 Hz.

FIG. 13 is a matrix showing the results of a numerical analysis of eigenvectors of a loudspeaker array in an embodiment of the present invention in the first-order radiation mode at 2,700 Hz.

FIG. 14 is a matrix showing the results of a numerical analysis of eigenvectors of a loudspeaker array in an embodiment of the present invention in the second-order radiation mode at 2,700 Hz.

FIG. 15 is a matrix showing the results of a numerical analysis of eigenvectors of a loudspeaker array in an embodiment of the present invention in the third-order radiation mode at 2,700 Hz.

FIG. 16 is a matrix showing the results of a numerical analysis of eigenvectors of a loudspeaker array in an embodiment of the present invention in the fourth-order radiation mode at 2,700 Hz.

FIG. 17 is a matrix showing the results of a numerical analysis of eigenvectors of a loudspeaker array in an embodiment of the present invention in the fifth-order radiation mode at 2,700 Hz.

FIG. 18 is a matrix showing the results of a numerical analysis of eigenvectors of a loudspeaker array in an embodiment of the present invention in the sixth-order radiation mode at 2,700 Hz.

FIG. 19 is a matrix showing the results of a numerical analysis of eigenvectors of a loudspeaker array in an embodiment of the present invention in the seventh-order radiation mode at 2,700 Hz.

V. DESCRIPTION OF EMBODIMENTS

Embodiments of the present invention will now be described with reference to the drawings. In the following description, identical elements are denoted by the same reference numbers and redundant explanations have been omitted.

Figure 1:
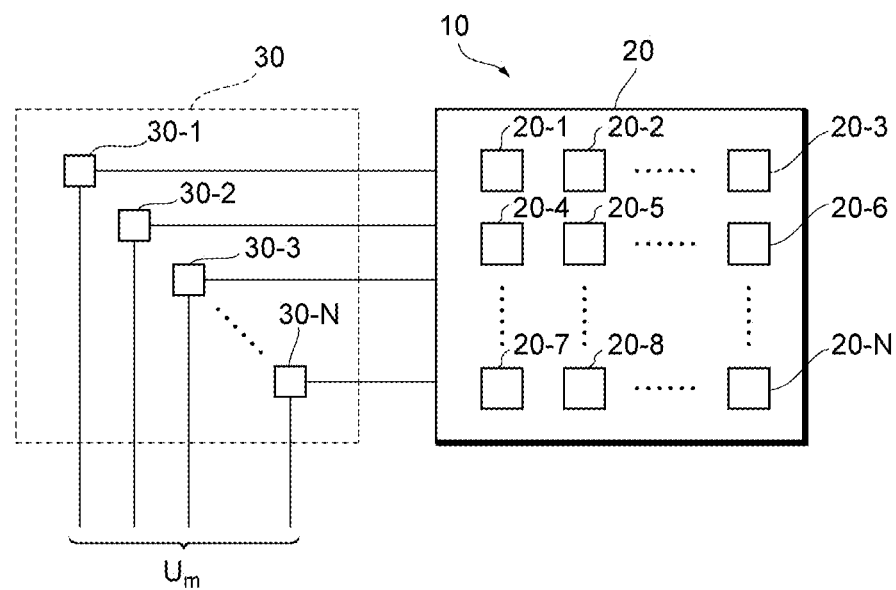
FIG. 1 is a diagram used to explain the configuration of an acoustic output device in an embodiment of the present invention.

FIG. 1 is a diagram used to explain the configuration of an acoustic output device 10 in an embodiment of the present invention. This acoustic output device 10 has a loudspeaker array 20 and an amplifier array 30. The loudspeaker array 20 has N loudspeakers (20-1, 20-2, 20 3, ..., 20-N) arranged in a two-dimensional plane. Here, N is an integer equal to or greater than 2. Before the loudspeaker array 20 can be driven, the eigenvectors of the predetermined radiation modes for the loudspeaker array 20 have to be calculated. Eigenvectors have N vector elements corresponding to the vibration velocities of each of the N loudspeakers (20-1, 20-2, 20-3, . . . , 20N). For example, the i-th vector element among the N vector elements of an eigenvector indicates the vibration velocity of the i-th loudspeaker 20-$i$ in the loudspeaker array 20. Here, i is an integer of 1 or more and N or less. The amplifier array 30 has N amplifiers (30-1, 30-2, 30 3, . . . , 30-N). The i-th amplifier 30-$i$ in the amplifier array 30 controls the amplitude and phase of the drive signals for the i-th loudspeaker 20-$i$ in the loudspeaker array 20 in accordance with the i-th vector element among the N vector elements of the eigenvector.

The sound generated by the loudspeaker array 20 (complex sound power) includes a component that reaches relatively far (an energy component that propagates in space) and a component that remains relatively close (a near-field energy component). The energy component that propagates in space corresponds to the real part of the complex sound power, and this energy component is referred to as the active sound power. The near-field energy component corresponds to the imaginary part of the complex sound power, and this energy component is referred to as the reactive sound power. The radiation modes with larger eigenvalues can increase the ratio of reactive sound power to active sound power, making them suitable for sound field localization. The ratio of reactive sound power to active sound power can be increased by calculating the eigenvectors of radiation modes with higher eigenvalues and controlling the amplitude and phase of each loudspeaker according to these calculated eigenvectors. In this way, sound field localization can be realized.

Eq. (1) has been established in which p is a complex sound pressure vector whose vector element is the complex sound pressure of each of the N loudspeakers (20-1, 20-2, 20 3, . . . , 20-N), V is a vibration vector whose vector element is the vibration velocity (the complex velocity in the normal direction of the vibration surface) of each of the N loudspeakers (20-1, 20 2, 20-3, . . . , 20-N), and Z is the specific acoustic impedance.

[Eq. 1]

$$P = ZV \qquad (1)$$

The complex sound power W can be described using Eq. (2).

[Eq. 2]

$$W = \frac{s}{2} V^H P \qquad (2)$$

Here, s is the area of the vibrating surface of each loudspeaker. In order to keep the explanation simple, it is assumed in Eq. (2) that the area of the vibrating surface of each loudspeaker is the same. However, the area of the vibrating surface of each loudspeaker does not have to be the same. Also, $V^H$ is the conjugate transpose matrix of the vibration vector V.

The complex sound power W can be divided into a real part and an imaginary part as shown in Eq. (3).

[Eq. 3]

$$W = Wr + jWi \qquad (3)$$

Here, Wr indicates the active sound power, and Wi indicates the reactive sound power.

The specific acoustic impedance Z can also be divided into a real part and an imaginary part as shown in Eq. (4).

[Eq. 4]

$$Z = Zr + jZi \qquad (4)$$

Here, $Z_r$ indicates the acoustic resistance and $Z_i$ indicates the acoustic reactance.

Eq. (5) and Eq. (6) can be obtained from Eq. (1) to Eq. (4).

[Eq. 5]

$$Wr = \frac{s}{2} V^H Zr V \qquad (5)$$

[Eq. 6]

$$Wi = \frac{s}{2} V^H Zi V \qquad (6)$$

Here, because the acoustic resistance $Z_r$ and the acoustic reactance $Z_i$ are not diagonal matrices, each loudspeaker does not independently contribute to the active acoustic power $W_r$ and reactive acoustic power $W_i$. Therefore, a real transformation matrix $\Phi$ that diagonalizes the acoustic resistance $Z_r$ and the acoustic reactance $Z_i$ has been considered. Eq. (7) and Eq. (8) are established by conducting diagonalization using a real transformation matrix $\Phi$.

[Eq. 7]

$$\Phi^T Zr \Phi = Dr \qquad (7)$$

[Eq. 8]

$$\Phi^T Zi \Phi = Di \qquad (8)$$

Here, $D_r$ and $D_i$ are diagonal matrices, and $\Phi^T$ is a transposed matrix of $\Phi$. By defining the vibration vector V as in Eq. (9), the complex sound power W can be described as in Eq. (10).

[Eq. 9]

$$v = \Phi U \qquad (9)$$

[Eq. 10]

$$w = \frac{s}{2} V^H (Zr + jZi) V = \frac{s}{2} U^H (Dr + jDi) U \qquad (10)$$

Here, each vector element of vector U contributes independently to the complex sound power W. Also, $U^H$ is a conjugate transposed matrix of vector U. The real transformation matrix $\Phi$ is a matrix in which the eigenvectors obtained by solving the generalized eigenvalue problem for the acoustic resistance $Z_r$ and the acoustic reactance $Z_i$ are arranged in each column. The generalized eigenvalue problem for real, symmetric, positive-definite acoustic resistance $Z_r$ and real, symmetric acoustic reactance $Z_i$ can be described as in Eq. (11).

[Eq. 11]

$$Zi\Phi = Xr\Phi\Lambda \qquad (11)$$

Here, $\Lambda$ is a diagonal matrix in which eigenvalues are arranged in each diagonal element. In order to solve the generalized eigenvalue problem, the standard eigenvalue problem for acoustic resistance $Z_r$ is solved first. A diagonal matrix $\Lambda_r$ of real, positive-definite eigenvalues and an orthogonal matrix $\Phi_r$ of real eigenvectors satisfy Eq. (12).

[Eq. 12]

$$\Phi_r^T Z_r \Phi_r = \Lambda_r \quad (12)$$

Here, $\Phi_r^T$ is a transposed matrix of $\Phi_r$. Using $\Phi_r \Lambda_r^{-1/2}$, the acoustic reactance $Z_i$ can be converted as shown in Eq. (13).

[Eq. 13]

$$Zi' = \left(\Phi r Ar^{-\frac{1}{2}}\right)^T Zi\left(\Phi r Ar^{-\frac{1}{2}}\right) \quad (13)$$

Here, $-1/2$ refers to the reciprocal of the square root of a diagonal element. $Z_{i'}$ is real and symmetric. Next, the standard eigenvalue problem is solved for $Z_{i'}$. A diagonal matrix $\Lambda$ in which real eigenvalues are arranged in each diagonal element and an orthogonal matrix $\Phi_i$ in which real eigenvectors are arranged in each column satisfy Eq. (14).

[Eq. 14]

$$\Phi i^T Zi' \Phi i = \Lambda \quad (14)$$

When $\Phi$ is defined as in Eq. (15), diagonalization becomes possible as shown in Eq. (16) and Eq. (17). Note that $\Phi$ is a real number matrix.

[Eq. 15]

$$\Phi = \Phi r \Lambda r^{-\frac{1}{2}} \Phi i \quad (15)$$

[Eq. 16]

$$\Phi^T Z_r \Phi = I \quad (16)$$

[Eq. 17]

$$\Phi^T Zi \Phi = \Lambda \quad (17)$$

Here, I is an identity matrix. Eq. (11) is obtained when both sides of Eq. (16) are multiplied by $\Lambda$ from the right and the result is compared with Eq. (17). Here, $\Lambda$ is a diagonal matrix in which eigenvalues are arranged in each diagonal element, and $\Phi$ is a matrix in which eigenvectors are arranged in each column. By performing diagonalization as shown in Eq. (16) and Eq. (17), the complex sound power W can be described as in Eq. (18).

[Eq. 18]

$$w = \frac{1}{2} U^H (I+j\Lambda) U \quad (18)$$

Vector U indicates the complex amplitude of each generalized radiation mode. It is clear from Eq. (18) that each radiation mode contributes independently to the complex sound power.

Eq. (9) and Eq. (18) can be described as Eq. (19) and Eq. (20), respectively, when only the m-th order radiation mode is excited.

[Eq. 19]

$$v = Um\Phi m \quad (19)$$

[Eq. 20]

$$Wm = |Um|^2 \frac{s}{2}(1 + j\lambda m) \quad (20)$$

Here, $\lambda_m$ is the m-th order eigenvalue, $\Phi_m$ is the m-th order eigenvector, and $U_m$ is the complex amplitude of the m-th order radiation mode. Also, $\Phi_m$ indicates the vibration velocity distribution of each loudspeaker in the m-th order radiation mode of the loudspeaker array 20. In the present specification, the radiation mode corresponding to the m-th highest eigenvalue is referred to as an m-th order radiation mode. Here, m is a positive number.

For example, when N=2, the eigenvector can be described as $\Phi_m = [\Phi_{1m} \Phi_{2m}]^t$. Here, $\Phi_{1m}$ indicates the vibration velocity of loudspeaker 20-1 in the m-th order radiation mode, and $\Phi_{2m}$ indicates the vibration velocity of loudspeaker 20-2 in the m-th order radiation mode. Radiation mode refers to a vibration velocity distribution in which each loudspeaker contributes to the complex sound power without being interconnected.

As can be understood from Eq. (20), eigenvalue $\lambda_m$ indicates the ratio $(W_i/W_r)$ of the reactive sound power Wi to the active sound power $W_r$ in the m-th order radiation mode. A radiation mode with a larger eigenvalue $\lambda_m$ is more suitable for sound field localization.

For example, when N=2, the sound field can be localized by driving loudspeakers 20-1 and 20-2 at a velocity distribution of $[V1\ V2]^t = [\Phi_{1m}\ \Phi_{2m}]^t U_m$. Here, for example, when $U_m = (1/\lambda_m)^{1/2}$ is set, the reactive sound power $W_i$ can be kept constant.

Signal $U_m$ is inputted to each of the N amplifiers (30-1, 30-2, 30-3, . . . , 30-N). The i-th amplifier 30-$i$ in the amplifier array 30 controls the amplitude and phase of the i-th loudspeaker 20-$i$ in the loudspeaker array 20 using drive signals obtained by multiplying the i-th vector element among the N vector elements of the eigenvector by signal $U_m$.

For example, when N=2, signal $U_m$ is inputted to both amplifier 30-1 and amplifier 30-2. Amplifier 30-1 drives loudspeaker 20-1 by using drive signals obtained by multiplying signal $U_m$ by $\Phi_{1m}$. Specifically, amplifier 30-1 adjusts the amplitude of drive signals used to drive loudspeaker 20-1 based on the magnitude (absolute value) of $\Phi_{1m}$, and adjusts the phase (polarity) of the drive signals used to drive loudspeaker 20-1 based on the sign (positive or negative) of $\Phi_{1m}$. Similarly, amplifier 30-2 drives loudspeaker 20-2 using drive signals obtained by multiplying signal $U_m$ by $\Phi_{2m}$. Specifically, amplifier 30-2 adjusts the amplitude of drive signals used to drive loudspeaker 20-2 based on the magnitude (absolute value) of $\Phi_{2m}$, and adjusts the phase (polarity) of the drive signals used to drive loudspeaker 20-2 based on the sign (positive or negative) of $\Phi_{2m}$. Because both the eigenvalue and the eigenvalue vector are real numbers, the phase of the drive signals for loudspeakers 20-1 and 20-2 only has to be adjusted by assigning either a positive sign or a negative sign.

In the explanation provided above, the number of amplifiers and the number of loudspeakers are the same. However, the number of amplifiers and the number of loudspeakers do not have to be the same. For example, when driving k loudspeakers among the N loudspeakers at the same amplitude and phase in a certain radiation mode, one amplifier may control the amplitude and phase of k loudspeakers at the same time. In this situation, there are fewer amplifiers than loudspeakers. Here, k is an integer of 1 or more and N or less.

Figure 2:
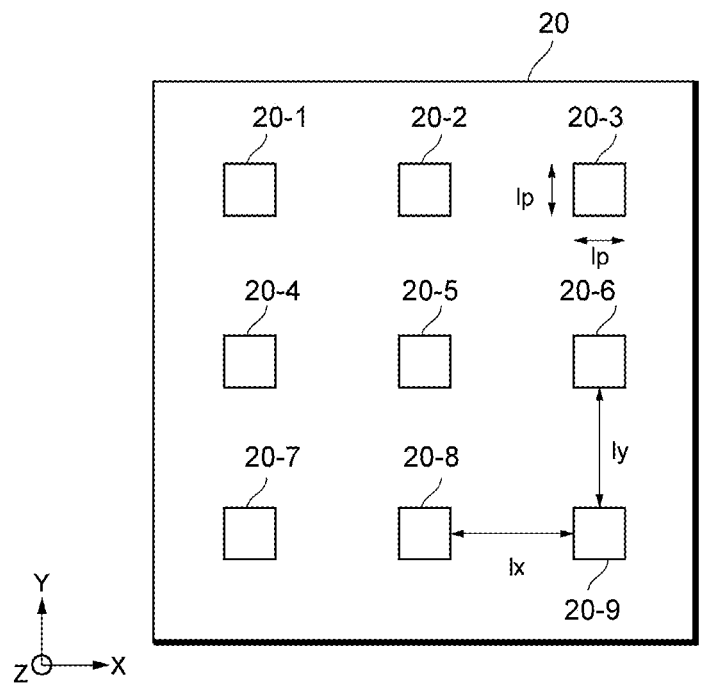
FIG. 2 is a diagram used to explain an example of a loudspeaker array in an embodiment of the present invention.

FIG. 2 is a diagram used to explain an example of a loudspeaker array 20 in an embodiment of the present invention. The loudspeaker array 20 shown in FIG. 2 is a simulation model for a numerical analysis of eigenvalues and eigenvectors. In this example, the loudspeaker array 20 has nine loudspeakers (20-1, 20-2, . . . , 20-9) arranged in three rows and three columns on an XY plane (infinite baffle) in XYZ space. Each loudspeaker is a square with a side length of lp. The distance between each loudspeaker in the X direction is lx, and the distance between each loudspeaker in the Y direction is ly. In the numerical analysis simulation, lp=0.01 m, lx=0.03 m, and ly=0.02 m. In the numerical analysis of eigenvalues and eigenvectors, it is assumed that sound is emitted into free space from a loudspeaker array 20 arranged on an infinite baffle.

Figures 3, 4:
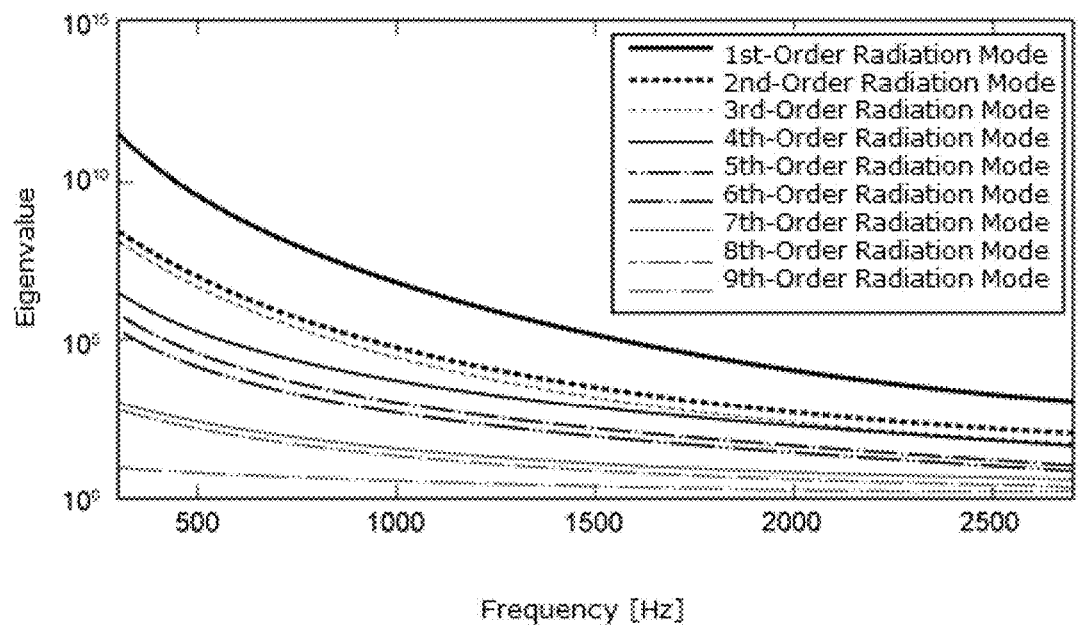
FIG. 3 is a graph showing the results of an analysis of the frequency characteristics of the eigenvalues for a loudspeaker array in an embodiment of the present invention.
FIG. 4 is a matrix showing the results of a numerical analysis of eigenvectors of a loudspeaker array in an embodiment of the present invention in the first-order radiation mode at 300 Hz.

FIG. 3 is a graph showing the results of an analysis of the frequency characteristics of the eigenvalues for the loudspeaker array 20 shown in FIG. 2. The horizontal axis in the graph denotes the frequency, and the vertical axis denotes the eigenvalues. Numerical analysis of the nine loudspeakers shown in FIG. 2 yielded nine eigenvalues corresponding to the first- to ninth-order radiation modes. It is clear that the eigenvalues are different for each radiation mode. It is also clear that the difference between eigenvalues becomes smaller as the frequency increases. From the results of the numerical analysis shown in FIG. 3, it is clear that the eigenvalues corresponding to the first-order radiation mode are larger than the eigenvalues corresponding to the other radiation modes at all frequencies. This means that, among the first- to ninth-order radiation modes, the first-order radiation mode is most suitable for sound field localization over a wide frequency range.

FIG. 4 to FIG. 12 show the results of a numerical analysis of the eigenvectors of the loudspeaker array 20 in FIG. 2 in the first- to ninth-order radiation modes at 300 Hz. FIG. 13 to FIG. 21 show the results of a numerical analysis of the eigenvectors of the loudspeaker array 20 in FIG. 2 in the first- to ninth-order radiation modes at 2,700 Hz. In FIG. 4 to FIG. 21, the vector elements of the eigenvectors are arranged in three rows and three columns in the same manner as the loudspeaker array 20, and indicate which vector elements are associated with which loudspeaker.

The vector element in the first row and first column of the eigenvectors shown in FIG. 4 to FIG. 21 indicates the vibration velocity of loudspeaker 20-1. The vector element in the first row and second column indicates the vibration velocity of the loudspeaker 20-2. The vector element in the first row and third column indicates the vibration velocity of the loudspeaker 20-3. The vector element in the second row and first column indicates the vibration velocity of the loudspeaker 20-4. The vector element in the second row and second column indicates the vibration velocity of the loudspeaker 20-5. The vector element in the second row and third column indicates the vibration velocity of the loudspeaker 20-6. The vector element in the third row and first column indicates the vibration velocity of the loudspeaker 20-7. The vector element in the third row and second column indicates the vibration velocity of the loudspeaker 20-8. The vector element in the third row and third column indicates the vibration velocity of the loudspeaker 20-9. A negative vibration velocity indicates that the vibration direction of the loudspeaker (that is, the phase of the sound waves generated by the loudspeaker) differs from the positive vibration velocity by 180°.

Each vector element of the eigenvectors shown in FIG. 4 to FIG. 21 is normalized by the vector element with the maximum value. Because the specific acoustic impedance depends on the frequency, the eigenvalues and the eigenvectors also depend on the frequency. However, as shown in FIG. 4 to FIG. 21, it is clear that the frequency dependence of eigenvectors in the same radiation mode is low. This means eigenvectors at a certain frequency (for example, 300 Hz) in a certain radiation mode can be used to realize sound field localization at a sufficient level for practical use in a frequency range (for example, 300 to 2,700 Hz) that includes this frequency (that is, 300 Hz). Here, because the frequency range from 300 to 2700 Hz is the band used for voice communication, it is suitable for sound field localization.

Figures 20, 21, 22:
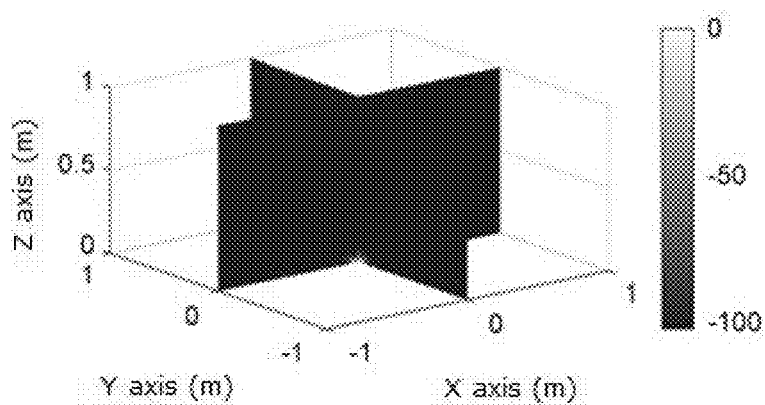
FIG. 20 is a matrix showing the results of a numerical analysis of eigenvectors of a loudspeaker array in an embodiment of the present invention in the eighth-order radiation mode at 2,700 Hz.
FIG. 21 is a matrix showing the results of a numerical analysis of eigenvectors of a loudspeaker array in an embodiment of the present invention in the ninth-order radiation mode at 2,700 Hz.
FIG. 22 is a graph of the sound pressure distribution when a loudspeaker array is driven using an acoustic output method according to an embodiment of the present invention.
Figure 23:
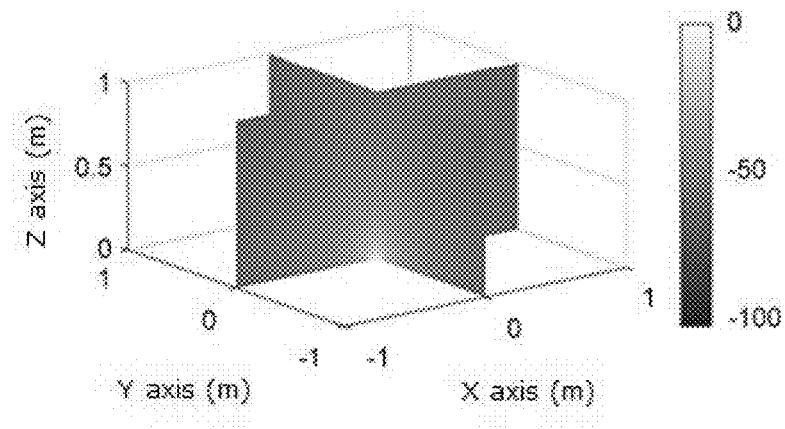
FIG. 23 is a graph of the sound pressure distribution when a loudspeaker array is driven using a method according to a prior art example.

FIG. 22 shows a graph of the sound pressure distribution (the sound pressure distribution in the XZ plane and the YZ plane in XYZ space) at 1,000 Hz when the loudspeaker array 20 in FIG. 2 is driven based on the eigenvectors of the first-order radiation mode. FIG. 23 shows a graph of the sound pressure distribution at 1,000 Hz (the sound pressure distribution in the XZ plane and the YZ plane in XYZ space) when all nine loudspeakers (20-1, 20-2, . . . , 20-9) are driven at the same phase and the same amplitude. The sound pressure level can be described as shown in Eq. (21).

[Eq. 21]

$$SPL = 20\log_{10}\left|\frac{P(y)}{P(y_0)}\right| \qquad (21)$$

Here, SPL indicates the sound pressure level [dB], P(y) indicates the complex sound pressure at a predetermined point (measurement point) determined by the coordinates (x, y, z), $P(y_0)$ indicates the complex sound pressure at the center of the loudspeaker array 20 in FIG. 2 (that is, the origin (0, 0, 0) in the XYZ space).

It is clear from a comparison of the graphs in FIG. 22 and FIG. 23 that sound field localization can be realized by driving the loudspeaker array 20 based on the eigenvectors of the first-order radiation mode.

Figure 24:
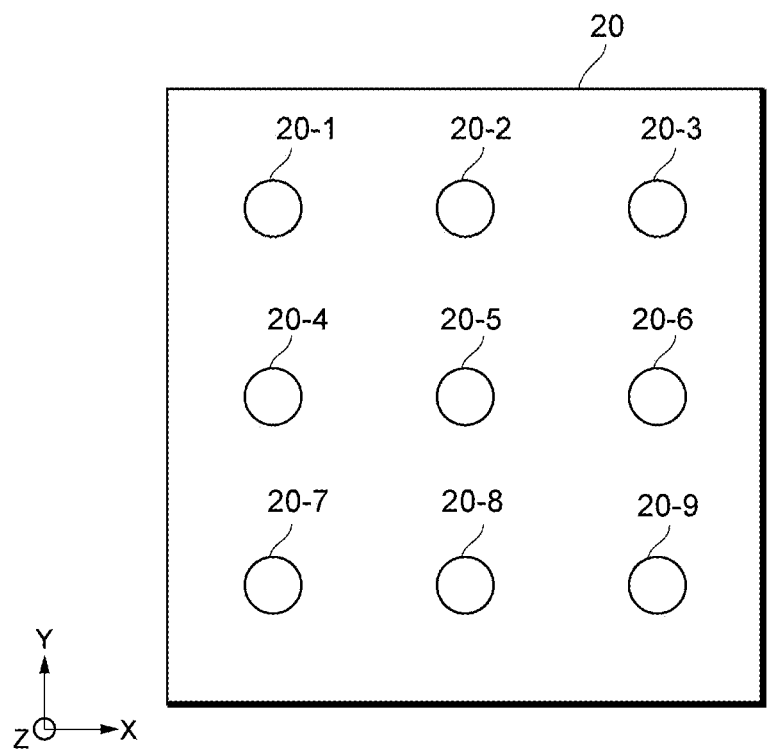
FIG. 24 is a diagram used to explain an example of a loudspeaker array in an embodiment of the present invention.

FIG. 24 is a schematic diagram of a loudspeaker array 20 that was actually created by the present applicant. The loudspeaker array 20 includes nine loudspeakers arranged in three rows and three columns on the XY plane (two-dimensional plane) in XYZ space, and the shape of each loudspeaker is circular. The loudspeaker indicated by reference number 20-5 is known as the center loudspeaker. The loudspeakers indicated by reference numbers 20-2 and 20-8 are known as the first reverse phase loudspeakers. The loudspeakers indicated by reference numbers 20-4 and 20-6 are known as the second reverse phase loudspeakers. The loudspeakers indicated by reference numbers 20-1, 20-3, 20-7, and 20-9 are known as the edge loudspeakers. The distance between the centers of two adjacent loudspeakers in the X direction is 0.05 m, and the distance between the centers of two adjacent loudspeakers in the Y direction is 0.04 m.

The center of the loudspeaker array 20 in FIG. 24 is the origin (0, 0, 0) of the XYZ space, and the sound pressure was measured at point (0, 0, z) separated from the origin by distance z in the Z direction by driving the loudspeaker array 20 in FIG. 24 based on the eigenvectors of the first-order radiation mode at 300 Hz (the eigenvectors shown in FIG. 4). The sound pressure was measured twice. In the first measurement, the input of a drive signal to the center loudspeaker 20-5 was delayed for a certain period of time (0.0005 seconds) relative to the input of a drive signal to the other loudspeakers. In the second measurement, there was no time delay in the drive signals inputted to all of the loudspeakers.

Figure 25:
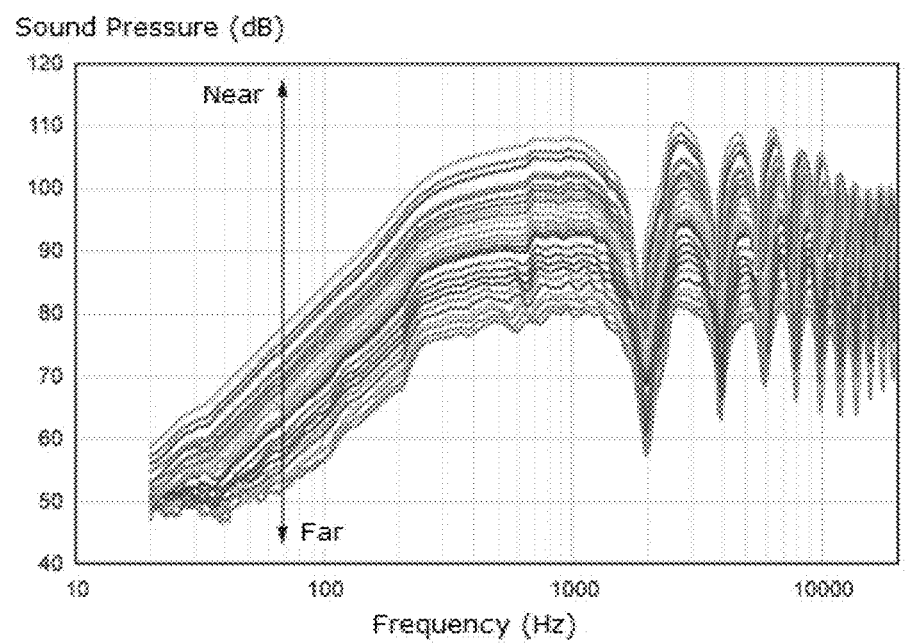
FIG. 25 is a graph of the distance-attenuated sound pressure frequency characteristics of a loudspeaker array in an embodiment of the present invention.
Figure 26:
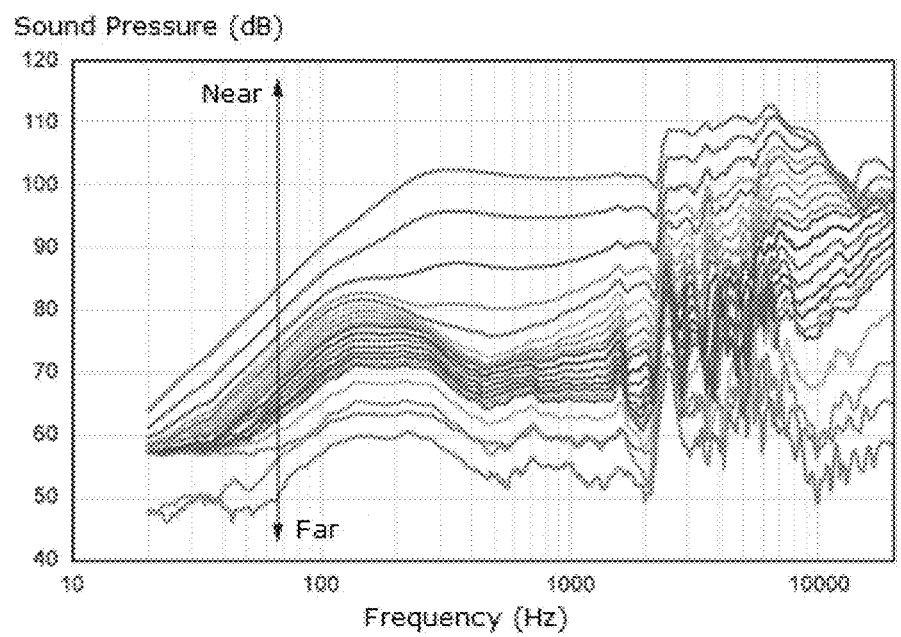
FIG. 26 is a graph of the distance-attenuated sound pressure frequency characteristics of a loudspeaker array in an embodiment of the present invention.

FIG. 25 is a graph showing the distance-attenuated sound pressure frequency characteristics in the first measurement. FIG. 26 is a graph showing the distance-attenuated sound pressure frequency characteristics in the second measurement. In FIG. 25 and FIG. 26, the horizontal axis denotes the frequency [Hz] and the vertical axis denotes the sound pressure [dB]. In the graphs shown in FIG. 25 and FIG. 26, "near distance" indicates distance-attenuated sound pressure frequency characteristics with a small z value, and "far distance" indicates distance-attenuated sound pressure frequency characteristics with a large z value.

In the first measurement, because there is a time delay in the input of a drive signal to the center loudspeaker 20-5 relative to the other loudspeakers, the decrease in sound pressure nearly matched the inverse square characteristic in the frequency range from about 300 to 1,000 Hz, and the decrease in sound pressure exceeded the inverse square characteristic in the frequency range from 2,000 to 3,000 Hz. In the second measurement, because there was no time delay in the input of drive signals to all of the loudspeakers, the decrease exceeded the inverse square characteristic in the frequency range from about 300 to 3,000 Hz. It is clear from these measurement results that a decrease in sound pressure exceeding the inverse square characteristic can be realized by setting the drive signal input to all loudspeakers so that there is no time delay.

Next, it was observed whether sufficient sound pressure attenuation occurred when the deviation in the phase difference from 180° in sound waves generated by two loudspeakers driven at substantially the same amplitude so that the phase difference determined from the eigenvectors is 180° is limited to a certain range at a point (0, 0, z) a predetermined distance from the center of the loudspeaker array 20 on the normal (Z axis) of the two-dimensional plane. Here, point (0, 0, z) is a point in XYZ space expected to obtain sufficient sound pressure attenuation through the realization of a personal acoustic space.

Figure 27:
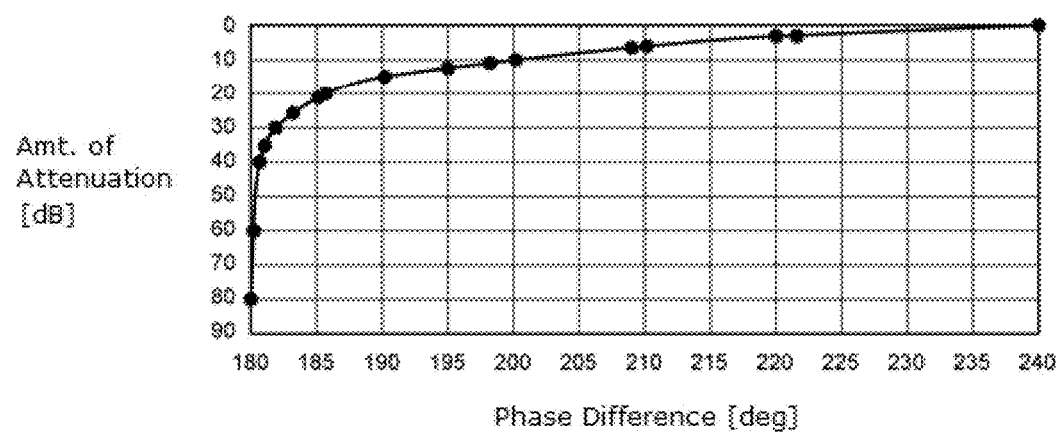
FIG. 27 is a graph showing the relationship between the phase difference of two sound waves with the same amplitude and the amount of attenuation in a combination of the two sound waves in an embodiment of the present invention.

FIG. 27 is a graph showing the relationship between the phase difference of two sound waves with the same amplitude and the amount of attenuation in a combination of the two sound waves in an embodiment of the present invention. In FIG. 27, the horizontal axis denotes the phase difference of the other sound wave using one of the two sound waves as a reference, and the vertical axis denotes the amount of attenuation. It is clear from this graph that attenuation of the combined waves can be obtained if the phase difference between the two sound waves is within 240°, that is, if the phase difference between the two sound waves deviates from 180° within ±60°. In order to realize a decrease in sound pressure at a sufficient level for practical use, attenuation of about 30 dB is desired. In order to obtain attenuation of about 30 dB, the phase difference between two sound waves with substantially the same amplitude is preferably within about 182°, that is, the phase difference between the two sound waves with substantially the same amplitude deviates from 180° within about ±2°. Two sound waves with substantially the same amplitude means two sound waves having a relationship in which the ratio of the amplitude of one of the two sound waves to the amplitude of the other sound wave is 0.97 or more.

Figure 28:
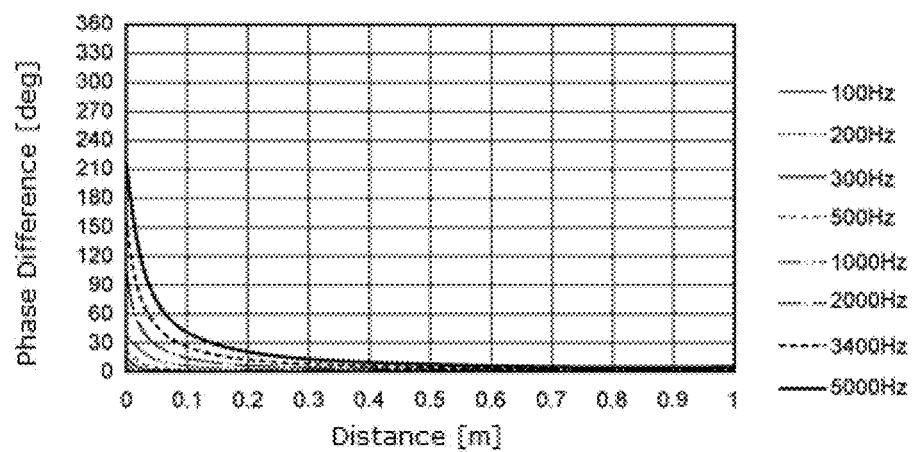
FIG. 28 is a graph showing the phase difference at different measurement points in an embodiment of the present invention.
Figure 29:
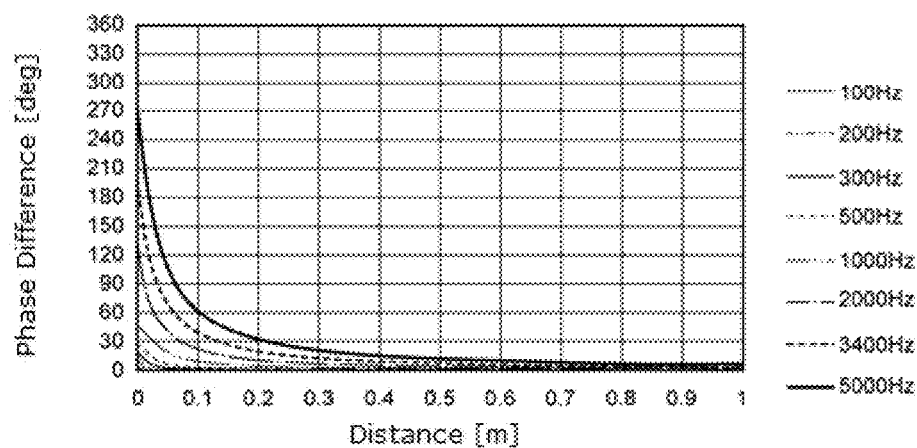
FIG. 29 is a graph showing the phase difference at different measurement points in an embodiment of the present invention.
Figure 30:
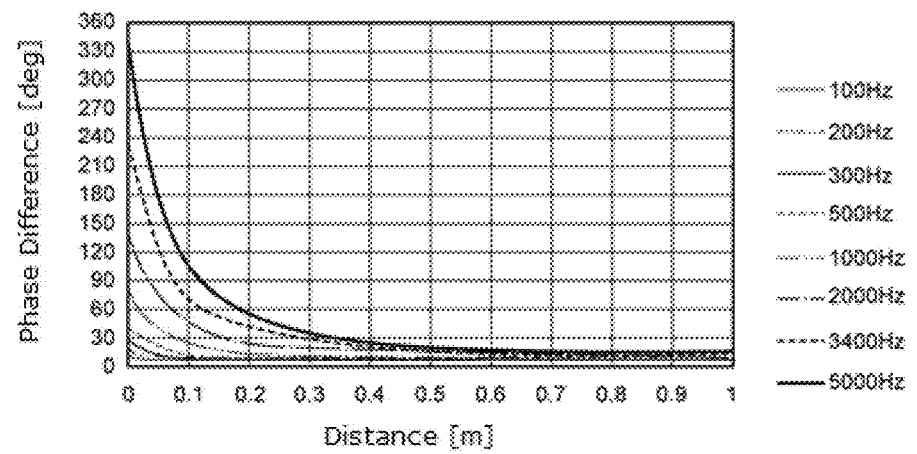
FIG. 30 is a graph showing the phase difference at different measurement points in an embodiment of the present invention.

Next, the present applicant calculated the phase difference of the sound waves at point (0, 0, z) as shown in FIG. 28 to FIG. 30 while changing the relative distance of point (0, 0, z) to the center loudspeaker 20-5 as well as the frequency of the sound waves.

In FIG. 28, the horizontal axis denotes the distance between the center loudspeaker 20-5 and point (0, 0, z). In FIG. 28, the vertical axis denotes the phase difference at point (0, 0, z) of the sound wave from the first reverse-phase loudspeaker 20-2 relative to the phase at point (0, 0, z) of the sound wave from the center loudspeaker 20-5.

In FIG. 29, the horizontal axis denotes the distance between the center loudspeaker 20-5 and point (0, 0, z). In FIG. 29, the vertical axis denotes the phase difference at point (0, 0, z) of the sound wave from the second reverse-phase loudspeaker 20-4 relative to the phase at point (0, 0, z) of the sound wave from the center loudspeaker 20-5.

In FIG. 30, the horizontal axis denotes the distance between the center loudspeaker 20-5 and point (0, 0, z). In FIG. 30, the vertical axis denotes the phase difference at point (0, 0, z) of the sound wave from an edge loudspeaker 20-1 relative to the phase at point (0, 0, z) of the sound wave from the center loudspeaker 20-5.

It is clear from the measurement results in FIG. 28 to FIG. 30 that changing the relative distance of point (0, 0, z) to the center loudspeaker 20-5 changes the phase difference of the sound waves measured at the point (0, 0, z). Also, the phase difference of the sound waves measured at point (0, 0, z) changes depending on the frequency of the sound waves, where a greater change in the phase difference occurs when the frequency of the sound waves is higher.

Note that in measurements similar to those performed in FIG. 28 to FIG. 30, when the input of a drive signal to the center loudspeaker 20-5 is delayed for a certain period of time (0.0005 seconds) relative to the input of a drive signal to the other loudspeakers, the phase differences of the sound waves measured at point (0, 0, z) at distances of about 0.1 to 1 m from the center loudspeaker 20-5 were 54°, 180°, 360°, and 252°, respectively, at frequencies of 300 Hz, 1,000 Hz, 2,000 Hz, and 3,400 Hz.

Also, when the input of a drive signal to the center loudspeaker 20-5 is delayed for a certain period of time (0.0005 seconds) relative to the input of a drive signal to the other loudspeakers, no increase or decrease was observed in the amplitude of the combined waves measured at point (0, 0, z) at around 300 Hz, the amplitude of the combined waves measured at point (0, 0, z) tended to increase at around 1,000 Hz, the amplitude of the combined waves measured at point (0, 0, z) tended to decrease at around 2,000 Hz, and the amplitude of the combined waves measured at point (0, 0, z) tended to increase at around 3,400 Hz.

Based on these measurement results, the upper limit for the sound wave frequency is preferably about 2,000 Hz in order to keep the deviation in the phase difference from 180° within ±60° for sound waves measured at point (0, 0, z) at a predetermined distance (for example, 0.05 m) from the center of the loudspeaker array 20 on the normal (Z axis) of the XY plane. Preferably, the distance between point (0, 0, z) and each loudspeaker, the upper limit of the frequency range for the sound waves, and the allowable time delay for the drive signals of each loudspeaker are set so that the deviation in the phase difference from 180° for sound waves with substantially the same amplitude generated by two loudspeakers driven so that the phase difference determined by the eigenvectors is 180° and within ±2° at point (0, 0, z) at a predetermined distance from the center of the loudspeaker array 20 on the normal (Z axis) of the XY plane. Even more preferably, the allowable time delay for the drive signals of each loudspeaker is set to substantially zero.

Figure 31:
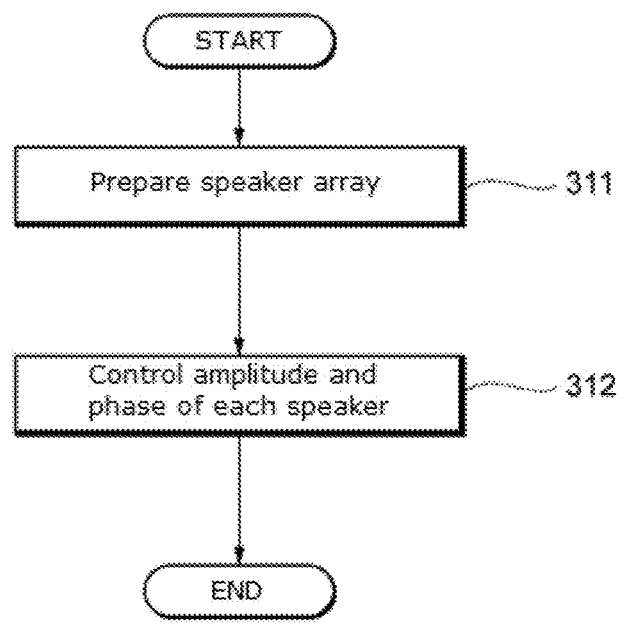
FIG. 31 is a flowchart showing the operational flow in an acoustic output method according to an embodiment of the present invention.

FIG. 31 is a flowchart showing the operational flow in an acoustic output method according to an embodiment of the present invention.

In step 311, a loudspeaker array 20 is prepared that has a plurality of loudspeakers (20-1, 20-2, 20-3, . . . , 20-N) arranged in a two-dimensional plane.

In step 312, the amplitude and phase of the drive signals for each loudspeaker are controlled by an amplifier array 30 with a plurality of amplifiers (30-1, 30-2, . . . , 30-N) according to the eigenvectors of the predetermined radiation mode for the loudspeaker array 20.

Because the frequency dependence of eigenvectors in the same radiation mode is low, eigenvectors at a certain frequency (for example, 300 Hz) in a certain radiation mode can be used to realize sound field localization at a sufficient level for practical use in a frequency range (for example, 300 to 2,700 Hz) that includes this frequency (that is, 300 Hz). As a result, the amplitude and phase for each loudspeaker do not have to be controlled using different eigenvectors for each frequency, and loudspeaker array 30 drive control can be simplified.

The embodiments described above were provided to better understand the present invention, and should not be interpreted as limiting the present invention. Modifications and improvements can be obtained which do not depart from the scope and spirit of the present invention, and these equivalents are encompassed by the present invention. In other words, those skilled in the art can make design changes to the embodiments when appropriate, and these are encompassed in the scope of the present invention to the extent that they include the characteristics of the present invention. The various elements in the embodiments can be combined where technically feasible, and these combinations are encompassed in the scope of the present invention to the extent that they include the characteristics of the present invention.

REFERENCE SIGNS LIST

10: Acoustic output device
20: Loudspeaker array
20-1, 20-2, . . . , 20-N: Loudspeaker
30: Signal processing circuit
40: Amplifier array
40-1, 40-2, . . . , 40-N: Amplifier

The invention claimed is:

1. An acoustic output device comprising:
 a loudspeaker array with a plurality of loudspeakers arranged in a two-dimensional plane; and
 an amplifier array with a plurality of amplifiers, the amplifier array controlling the amplitude and phase of a drive signal for each loudspeaker according to an eigenvector whose ratio of a reactive sound power to an active sound power is large enough among eigenvalue vectors of a radiation mode that are vibration velocity components independently contributing to a complex sound power.

2. An acoustic output device according to claim 1, wherein the eigenvector is an eigenvector at a certain frequency of the radiation mode, and
 wherein the amplifier array controls the amplitude and phase of a drive signal for each loudspeaker in a certain frequency range including the certain frequency.

3. An acoustic output device according to claim 1, wherein the radiation mode is a radiation mode corresponding to an eigenvalue above a threshold value.

4. An acoustic output device comprising:
 a loudspeaker array with a plurality of loudspeakers arranged in a two-dimensional plane; and
 an amplifier array with a plurality of amplifiers, the amplifier array controlling the amplitude and phase of a drive signal for each loudspeaker according to eigenvectors of a predetermined radiation mode of the loudspeaker array,
 wherein the distance between a point and each loudspeaker, the upper limit of the frequency range, and the allowable time delay for the drive signals are predetermined so that the deviation in the phase difference from 180° in sound waves generated by two loudspeakers driven at substantially the same amplitude so that the phase difference determined from the eigenvectors is 180° and limited to a predetermined angular range at the point, which is a predetermined distance from the center of the loudspeaker array on the normal of the two-dimensional plane.

5. An acoustic output device according to claim 4, wherein the predetermined angle range is ±2°.

6. An acoustic output device according to claim 4, wherein the allowable time delay for a drive signal is substantially zero.

7. An acoustic output method comprising:
 preparing a loudspeaker array with a plurality of loudspeakers arranged in a two-dimensional plane; and
 causing an amplifier array with a plurality of amplifiers to control the amplitude and phase of a drive signal for each loudspeaker according to an eigenvector whose ratio of a reactive sound power to an active sound power is large enough among eigenvalue vectors of a radiation mode that are vibration velocity components independently contributing to a complex sound power.

* * * * *